(12) United States Patent
Yoon et al.

(10) Patent No.: US 11,133,370 B2
(45) Date of Patent: Sep. 28, 2021

(54) ORGANIC LIGHT EMITTING DIODE DISPLAY DEVICE AND MANUFACTURING METHOD THEREOF

(71) Applicant: SAMSUNG DISPLAY CO., LTD., Yongin-si (KR)

(72) Inventors: Kap Soo Yoon, Seoul (KR); Chan Woo Yang, Siheung-si (KR); June Whan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/742,449

(22) Filed: Jan. 14, 2020

(65) Prior Publication Data

US 2020/0227509 A1 Jul. 16, 2020

(30) Foreign Application Priority Data

Jan. 15, 2019 (KR) ........................ 10-2019-0005325

(51) Int. Cl.
| | |
|---|---|
| *H01L 27/14* | (2006.01) |
| *H01L 27/32* | (2006.01) |
| *H01L 51/52* | (2006.01) |
| *H01L 51/56* | (2006.01) |
| *H01L 51/00* | (2006.01) |

(52) U.S. Cl.
CPC ........ *H01L 27/3276* (2013.01); *H01L 27/322* (2013.01); *H01L 27/3248* (2013.01); *H01L 27/3272* (2013.01); *H01L 51/5218* (2013.01); *H01L 51/5253* (2013.01); *H01L 51/56* (2013.01); *H01L 51/0023* (2013.01); *H01L 2227/323* (2013.01); *H01L 2251/301* (2013.01); *H01L 2251/308* (2013.01); *H01L 2251/558* (2013.01)

(58) Field of Classification Search
CPC ............... H01L 27/322; H01L 27/3248; H01L 27/3272; H01L 27/3276; H01L 51/5218; H01L 51/5253; H01L 51/56
USPC ............................................. 257/40, 59, 72
See application file for complete search history.

(56) References Cited

U.S. PATENT DOCUMENTS

| | | | |
|---|---|---|---|
| 9,379,252 B2 | 6/2016 | Lee et al. | |
| 2018/0095195 A1* | 4/2018 | Kim | ........................ G02B 5/003 |
| 2018/0097047 A1* | 4/2018 | Jung | ................... H01L 27/3248 |

(Continued)

FOREIGN PATENT DOCUMENTS

| | | |
|---|---|---|
| KR | 10-2013-0009501 | 1/2013 |
| KR | 10-2016-0075966 | 6/2016 |

(Continued)

*Primary Examiner* — Tan N Tran
(74) *Attorney, Agent, or Firm* — F. Chau & Associates, LLC

(57) ABSTRACT

An organic light emitting diode display includes a substrate including a display area and a pad area, a first thin film transistor disposed on the display area, an organic light emitting diode connected to the first thin film transistor, a pad electrode disposed on the pad area and a pad contact electrode disposed on an upper portion of the pad electrode and electrically connected to the pad electrode. The organic light emitting diode includes an anode, an organic emission layer, and a cathode. The anode includes a lower layer, an intermediate layer, and an upper layer. The pad contact electrode is formed of a material of the lower layer of the anode.

16 Claims, 23 Drawing Sheets

(56) References Cited

U.S. PATENT DOCUMENTS

2018/0122877 A1* 5/2018 Beak .................... H01L 27/3262
2019/0006452 A1* 1/2019 Oho ..................... G09G 3/3233

FOREIGN PATENT DOCUMENTS

KR   10-2016-0141315   12/2016
KR   10-2018-0052912    5/2018

* cited by examiner

FIG. 3

| Step | PXL | PAD |
|---|---|---|
| 14-1 Anode Photo /Anode 1st Wet Etch | PR / ITO 70Å / Ag 850Å / Ti 100~500Å | PR / ITO / Ag |
| 14-2 Ti Dry Etch | PR / ITO / Ag / Ti (191) | PR / ITO / Ag / Ti (197') |
| 14-3 PR Ashing | PR / ITO / Ag / Ti | ITO / Ag / Ti |
| 14-4 Anode 2nd Wet Etch /PR strip | ITO / Ag / Ti | Ti (197) |

… (1) …

ORGANIC LIGHT EMITTING DIODE DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2019-0005325 filed in the Korean Intellectual Property Office on Jan. 15, 2019, the disclosure of which is incorporated by reference herein its entirety.

BACKGROUND

(a) Field

The present invention relates to an organic light emitting diode display and a manufacturing method thereof, and more particularly to an organic light emitting diode display and a manufacturing method thereof, including a triple layer structure.

(b) Description of the Related Art

Organic light emitting diode (OLED) displays have received much attention as display devices for displaying images.

The OLED displays have a self-emission characteristic, eliminating a light source, unlike a liquid crystal display (LCD) device, and thus can be fabricated to be thinner and lighter. Further, the OLED displays have high quality characteristics such as low power consumption, high luminance, high response speed, and the like.

However, the OLED displays have a complex pixel structure, using more masks, and requiring a long processing time, compared to a liquid crystal display.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide an organic light emitting diode display and a manufacturing method thereof, which may be manufactured by using fewer masks.

According to an exemplary embodiment, an organic light emitting diode display includes a substrate including a display area and a pad area, a first thin film transistor disposed on the display area, an organic light emitting diode connected to the first thin film transistor, a pad electrode disposed on the pad area and a pad contact electrode disposed on an upper portion of the pad electrode and electrically connected to the pad electrode. The organic light emitting diode includes an anode, an organic emission layer, and a cathode. The anode includes a lower layer, an intermediate layer, and an upper layer. The pad contact electrode is formed of a material of the lower layer of the anode.

According to an exemplary embodiment of the present inventive concept, a manufacturing method of an organic light emitting diode display is provided as follows. A substrate including a display area and a pad area is prepared. An upper insulating layer is formed on the substrate. A pre-heat treatment is performed on the upper insulating layer. A plurality of layers including a lower layer is formed on the upper insulating layer. An anode of an organic light emitting diode and a pad contact electrode are formed from the plurality of layers in the display area and the pad area respectively.

BRIEF DESCRIPTION OF THE DRAWINGS

FIG. 3 is a detailed view illustrating an anode manufacturing process in a manufacturing process of an organic light emitting diode display according to an exemplary embodiment of the present invention.

DETAILED DESCRIPTION OF THE EMBODIMENTS

Figure 1:
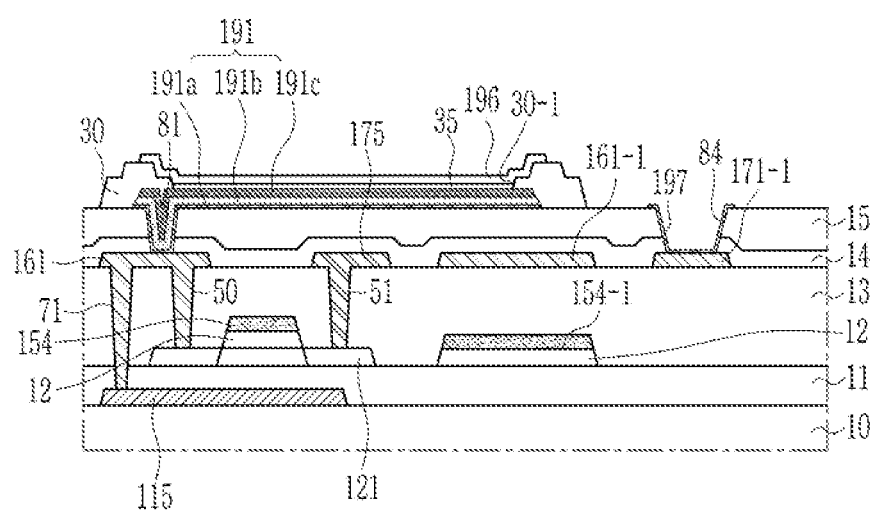
FIG. 1 illustrates a cross-sectional view of an organic light emitting diode display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the present invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Hereinafter, an organic light emitting diode display according to an exemplary embodiment will be described with reference to FIG. 1.

FIG. 1 illustrates a cross-sectional view of an organic light emitting diode display according to an exemplary embodiment.

According to the present exemplary embodiment, the organic light emitting diode display includes a substrate 10, a metal layer 115, a buffer layer 11, a first semiconductor layer 121, a gate insulating layer 12, gate conductive layers 154 and 154-1, an interlayer insulating layer 13, data conductive layers 161, 161-1, 175, and 171-1, a passivation layer 14, an upper insulating layer 15, an anode 191, an organic emission layer 35, a cathode 196, a partition wall 30, and a pad contact electrode 197. Herein, the anode 191, the organic emission layer 35, and the cathode 196 together constitute one organic light emitting diode (OLED).

The organic light emitting diode and a thin film transistor connected thereto are formed on the substrate 10. The substrate 10 may be formed as a rigid substrate such as glass. However, the present invention is not limited thereto. According to another exemplary embodiment, it may be formed of a film such as a plastic or polyimide (PI), which may be flexible.

The metal layer 115 is formed on the substrate 10. The metal layer 115 may be formed of a conductive metal material. The metal material used for the metal layer 115 may include titanium (Ti), molybdenum (Mo), copper (Cu), or the like, and may be formed to have a single layer structure using only a single metal material or a double-layer structure using two metal materials. For example, the double-layer structure may be obtained by forming titanium (Ti) as a lower layer and copper (cu) as an upper layer. The metal layer 115 is formed at a position where the first semiconductor layer 121 of the thin film transistor is to be formed, thereby constantly maintaining a voltage characteristic of the first semiconductor layer 121, for increasing the performance of the thin film transistor.

The substrate 10 and the metal layer 115 are covered with the buffer layer 11. The buffer layer 11 may be formed of an inorganic insulating layer such as silicon oxide (SiOx) or silicon nitride (SiNx).

The first semiconductor layer 121 is formed on the buffer layer 11. The first semiconductor layer 121 may be formed of an oxide semiconductor. For the convenience of description, the first semiconductor layer 121 is assumed to be formed of indium gallium zinc oxide (IGZO) in the present exemplary embodiment. The first semiconductor layer 121 is formed at a position where a thin film transistor is to be formed, and includes a channel region, a source region, and a drain region.

The first semiconductor layer 121 and the buffer layer 11 are covered by the gate insulating layer 12. The gate insulating layer 12 may be formed as an inorganic insulating layer including, for example, silicon oxide (SiOx). According to another exemplary embodiment, the gate insulating layer 12 may include silicon nitride (SiNx). The gate insulating layer 12 of the present exemplary embodiment is formed only in a region where the gate conductive layers 154 and 154-1 to be described later are disposed. However, the present invention is not limited thereto. For example, the gate insulating layer 12 may be formed on the entire region of the substrate 10.

The gate conductive layers 154 and 154-1 are formed on the gate insulating layer 12. The gate conductive layers 154 and 154-1 include a gate electrode 154 and a first electrode 154-1 for a storage capacitor respectively. The gate electrode 154 is formed on a position overlapping the channel region of the first semiconductor layer 121. The gate insulating layer 12 having a same shape as the gate electrode 154 is disposed between the gate electrode 154 and the first semiconductor layer 121. The gate insulating layer 12 having a same shape as the first electrode 154-1 for the storage capacitor is also formed therebelow. According to another exemplary embodiment, the first electrode 154-1 for the storage capacitor and the gate electrode 154 may be electrically connected to each other. The gate conductive layers 154 and 154-1 may be formed of a metal material, and in this embodiment, the gate conductive layers 154 and 154-1 are formed to have a double-layer structure including a lower layer including titanium (Ti) and an upper layer including copper (Cu). However, the present invention is not limited thereto. According to another exemplary embodiment, the gate conductive layers 154 and 154-1 may be formed of a single layer or may be formed of various metal materials.

The exposed buffer layer 11, the gate conductive layers 154 and 154-1, and the gate insulating layer 12 each of which having a side exposed are covered with the interlayer insulating layer 13. The interlayer insulating layer 13 may be formed of an inorganic insulating layer such as silicon oxide (SiOx), silicon nitride (SiNx), or silicon oxynitride (SiON). The interlayer insulating layer 13 may be formed of the inorganic insulating layer, and it may be thickly formed to have a certain thickness or more. In the case of the inorganic insulating layer, a step of a layer disposed at a lower portion thereof is also provided at an upper portion thereof, but when the inorganic insulating layer is thickly formed, the step of the lower portion may be provided less at the upper portion, thereby serving to reduce the step. In an exemplary embodiment, the interlayer insulating layer 13 may provide a planarized surface for its subsequence process.

Openings 50 and 51 for exposing the source region and the drain region of the first semiconductor layer 121 are formed in the interlayer insulating layer 13, respectively. In addition, an opening 71 exposing the metal layer 115 is formed in the interlayer insulating layer 13 and the buffer layer 11.

The data conductive layers 161, 161-1, 175, and 171-1 are formed on the interlayer insulating layer 13. The data conductive layers 161, 161-1, 175, and 171-1 include an output side electrode 161, an input side electrode 175 (hereinafter also referred to as a driving voltage line), a second electrode 161-1 for a storage capacitor, and a pad electrode 171-1.

The output side electrode 161 is electrically connected to the drain region of the first semiconductor layer 121 of the thin film transistor through the opening 50, and is electrically connected to the metal layer 115 through another opening 71. That is, the drain electrode may transfer an output of the thin film transistor to the metal layer 115 as an electrode for transferring the output of the thin film transistor to another element. In addition, the drain electrode may transfer an output current of the thin film transistor to the anode 191 to be described later. The input side electrode 175 is electrically connected to the source region of the first semiconductor layer 121 of the thin film transistor through the opening 51.

The input side electrode 175 may be electrically connected to a driving voltage line to which the driving voltage ELVDD is applied, although this is not illustrated. As a result, the thin film transistor may transfer an output current to the output side electrode 161 by using the voltage difference between the input side electrode 175 and the gate electrode 154.

The second electrode 161-1 for the storage capacitor is formed on the first electrode 154-1 for the storage capacitor, and constitutes a storage capacitor together with the first electrode 154-1 for the storage capacitor and the interlayer insulating layer 13 disposed therebetween. The second electrode 161-1 for the storage capacitor may be connected to a particular terminal, and may be electrically connected to the output side electrode 161 in the present exemplary embodiment. According to another exemplary embodiment, it may be electrically connected to a driving voltage line to which the driving voltage ELVDD is applied.

The pad electrode 171-1 is disposed on an end of the data line (see FIG. 14), and is disposed in the pad area positioned around the display area, instead of the display area for displaying the image. The data voltage transferred to the pad electrode 171-1 may be transferred to each pixel PX through the data line.

The data conductive layers 161, 161-1, 175, and 171-1 may be formed of a metal material, and in the present exemplary embodiment, they are formed to have a double-layer structure including a lower layer including titanium (Ti) and an upper layer including copper (Cu). However, the present invention is not limited thereto. In an exemplary embodiment, data conductive layers 161, 161-1, 175, and 171-1 may be formed of a single layer or may be formed of various metal materials.

The passivation layer 14 is formed on the data conductive layers 161, 161-1, 175, and 171-1 and the exposed interlayer insulating layer 13. The passivation layer 14 may be formed of an inorganic insulating layer such as a silicon oxynitride (SiON). The present invention is not limited thereto. In an exemplary embodiment, the passivation layer 14 may be formed of silicon oxide (SiOx) or silicon nitride (SiNx).

The upper insulating layer 15 is formed on the passivation layer 14. The upper insulating layer 15 may be formed of an organic insulator such as a polyimide (PI) in the present exemplary embodiment. The present invention is not limited thereto. According to another exemplary embodiment, the upper insulating layer 15 may be formed of various organic insulating materials.

The passivation layer 14 and the upper insulating layer 15 include an opening 81 exposing the output side electrode 161 and an opening 84 exposing the pad electrode 171-1 in the pad area.

The anode 191 having a triple layer structure and the pad contact electrode 197 having a single layer structure are formed on the upper insulating layer 15. The anode 191 and the pad contact electrode 197 may be formed using a same process, and the pad contact electrode 197 may be formed by removing at least one layer of the anode 191 having a plurality of layers. For example, the anode 191 has a triple layer structure, and the pad contact electrode 197 has a single layer structure formed by removing two layers of the triple layer structure. For example, the anode 191 may include a lower layer 191a including titanium (Ti), an intermediate layer 191b including silver (Ag), and an upper layer 191c including indium tin oxide (ITO), and the pad contact electrode 197 may be formed of a same layer as the lower layer 191a of the anode 191. In an exemplary embodiment, the pad contact electrode 197 and the lower layer 191a of the anode 191 may be a layer including titanium (Ti). However, the present invention is not limited thereto. In an exemplary embodiment, the lower layer 191a of the anode 191 may be formed of various conductive materials including a transparent conductive material such as ITO or IZO in addition to the metal material.

The anode 191 is electrically connected to the output side electrode 161 through the opening 81 formed in the passivation layer 14 and the upper insulating layer 15. As a result, an output current of the output electrode 161 is transferred to the anode 191, which is one electrode of the organic light emitting diode (OLED).

The pad contact electrode 197 is electrically connected to the pad electrode 171-1 through the opening 84 formed in the passivation layer 14 and the upper insulating layer 15. That is, a data voltage supplied from the outside (data driver) is transferred to the pad contact electrode 197, and is transmitted to the data line through the pad electrode 171-1. The pad contact electrode 197 may be formed to be wider than the pad electrode 171-1 so as to easily receive a voltage from the outside. In addition, the pad contact electrode 197 is exposed to be connected with a connector (not illustrated), and will be covered by the connector while the connector is connected thereto.

In the present exemplary embodiment, since an upper layer among multiple layers of the data conductive layers 161, 161-1, 175, and 171-1 may contain copper (Cu), when it is electrically connected to the pad contact electrode 197 and the anode 191 through the openings 81 and 84, a contact characteristic thereof may be poor. In an exemplary embodiment, the contact characteristic of the upper layer of each of the data conductive layers 161, 161-1, 175, and 171-1 may include adhesion thereof to each of the pad contact electrode 197 and the anode 191. A layer for improving the contact characteristic may be additionally formed in order to overcome this poor contact characteristic. However, according to an exemplary embodiment of the present invention, the contact characteristic with copper (Cu) is increased without adding a process by allowing a lower layer of the anode 191 and the pad contact electrode 197 to contain titanium (Ti) without forming an additional layer (e.g., an ITO layer).

The organic emission layer 35 and the partition wall 30 are formed on the anode 191. The partition walls 30 may be formed of an organic material such as a polyimide (PI) in the present exemplary embodiment. The partition wall 30 may define a position where the organic emission layer 35 is to be formed, and may be formed along an outer circumference of the anode 191.

The organic emission layer 35 is formed in an opening 30-1 defined by the partition wall 30. Although the organic emission layer 35 is illustrated as a single layer in FIG. 1, an auxiliary layer such as an electron injecting layer, an electron transporting layer, a hole transporting layer, or a hole injecting layer is also included above and/or below the emission layer. The emission layer may be formed to emit red, green, or blue light depending on a type thereof. However, in the exemplary embodiment of FIG. 20, a layer for displaying a separate color may be further included, and the emission layer may be configured to display one color. In other words, all the light emitted through the organic emission layer 35 may display a same color, but three primary colors of light such as red, green, and blue may be displayed through a color conversion layer 230 to be described later disposed in each pixel.

The cathode 196 is formed on the partition wall 30 and the organic emission layer 35 as a transparent conductive layer. That is, light emitted from the organic emission layer 35 is transferred to the outside through the cathode 196, such that it is visible to the user's eyes. Such a structure is referred to as a front emission structure.

The anode 191, the organic emission layer 35, the partition wall 30, and the cathode 196 are not formed in the pad area, but are formed in the display area.

Figure 20:
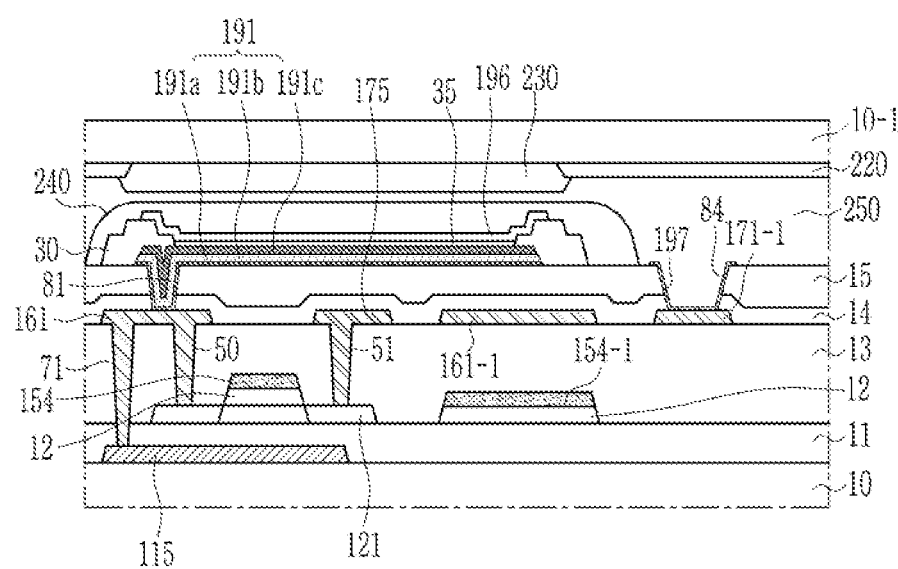
FIG. 20 illustrates a cross-sectional view of an organic light emitting diode display according to an exemplary embodiment.

Although not illustrated, a capping layer 240 of FIG. 20 is formed on the cathode 196 to block air or moisture from being transmitted into the organic emission layer 35.

The thin film transistor described above may be a driving transistor that generates an output current to control the degree of emission of an organic light emitting diode (OLED).

The organic light emitting diode display is divided into a display area and a pad region. The pad area indicates a periphery of a region where the pad electrode 171-1 is disposed, and the display area indicates an area excluding the pad area. According to another exemplary embodiment, the pad area may be included in the peripheral area, and the peripheral area is the region surrounding the display area. The display area is an area in which a pixel PX including an organic light emitting diode (OLED) is formed to display an image.

Hereinafter, a manufacturing method of an organic light emitting diode display according to the exemplary embodiment of FIG. 1 will be described with reference to FIG. 2 to FIG. 15.

Figure 2:
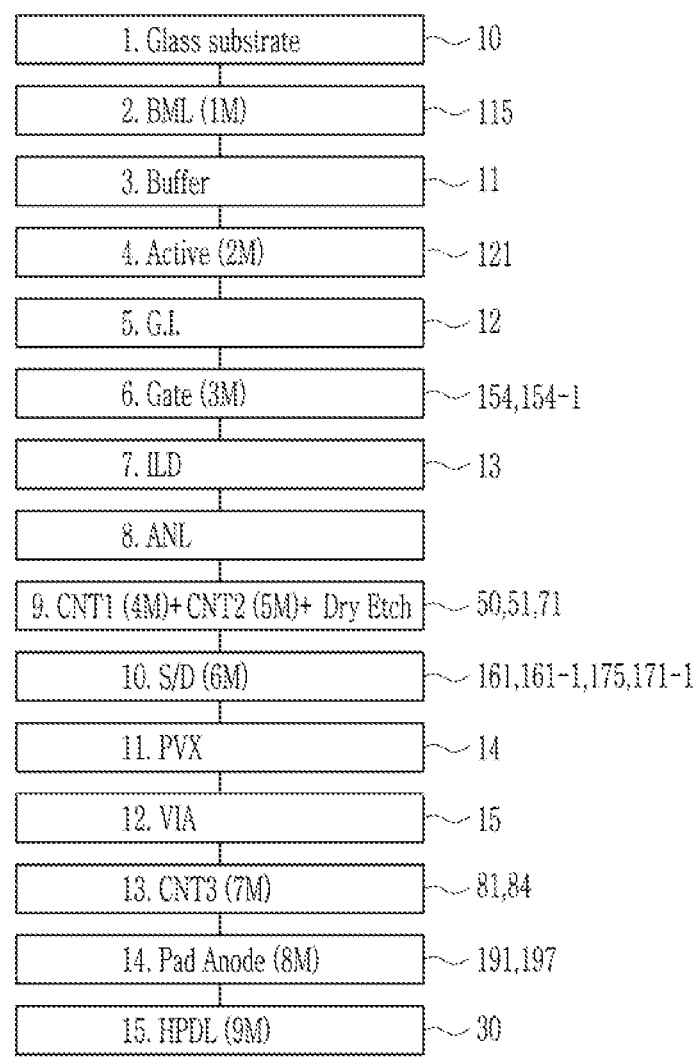
FIG. 2 illustrates a manufacturing order of an organic light emitting diode display according to an exemplary embodiment.

FIG. 2 illustrates a manufacturing order of an organic light emitting diode display according to an exemplary embodiment, FIG. 3 is a detailed view illustrating an anode manufacturing process in a manufacturing process of an organic light emitting diode display according to an exemplary embodiment of the present invention, and FIG. 4 to FIG. 13 are cross-sectional views illustrating the organic light emitting diode display of FIG. 1 depending on each manufacturing step.

First, FIG. 2 illustrates a manufacturing process of the partition wall 30, and FIG. 4 to FIG. 13 illustrate processes that are completed in the exemplary embodiment of FIG. 1 for each step of FIG. 2. FIG. 3 illustrates several steps into which a fourteenth step (Pad anode electrode) of FIG. 2 is divided in more detail.

Hereinafter, the respective steps of FIG. 2 will be described with reference to FIG. 4 to FIG. 13 corresponding thereto, and the detailed steps of FIG. 3 will be described when the fourteenth step (pad anode electrode) is described.

First, in FIG. 2, steps are classified by sequentially numbering them in a box in order to easily distinguish each step, and numbers located outside the box are indicated by reference numerals of the layers associated with the step so as to identify which layer is formed. In FIG. 2, a process where the mask is used is indicated by M, and the number before M indicates the number of the mask.

A first step (Glass substrate) of FIG. 2 represents a step of preparing the substrate 10. In the present exemplary embodiment, a glass substrate is used as the substrate 10.

A second step (BML) represents a step of forming the metal layer 115 on the substrate 10. In FIG. 2, "1M" in the second step indicates that the metal layer 115 is formed by using a first mask. That is, the metal layer 115 is patterned using the first mask 1M after the material for forming the metal layer 115 is stacked. In this case, a photoresist is stacked on the material for forming the metal layer 115, and a photoresist pattern is first formed by exposing the photoresist with the first mask 1M, and then the material for forming the metal layer 115 is patterned depending on the photoresist pattern to form the metal layer 115. Each layer may be formed in the same manner as described below unless otherwise described. The metal material used for the metal layer 115 may be titanium (Ti), molybdenum (Mo), copper (Cu), or the like, and may be formed to have a single layer structure using only a single metal material or a double-layer structure using two metal materials. For example, the double-layer structure may be obtained by forming a lower layer with titanium (Ti) and an upper layer with copper (Cu).

Figure 4:
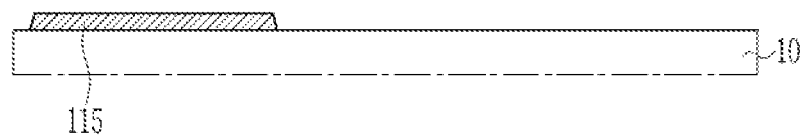
FIG. 4 to FIG. 13 are cross-sectional views illustrating the organic light emitting diode display of FIG. 1 depending on each manufacturing step.

A cross-sectional view after the completion of the first step (Glass substrate) and the second step (BML) is illustrated in FIG. 4.

A third step (Buffer) represents a step of stacking the buffer layer 11 on the substrate 10 and the metal layer 115. In the third step (Buffer), no separate mask is used to form a pattern. The buffer layer 11 may be formed of an inorganic insulating layer such as silicon oxide (SiOx) or silicon nitride (SiNx).

A fourth step (Active) represents a step of forming a first semiconductor layer 121 on the buffer layer 11 into a specific pattern by using a second mask 2M. The first semiconductor layer 121 may be formed of oxide semiconductor, e.g., indium gallium zinc oxide (IGZO).

Figure 5:
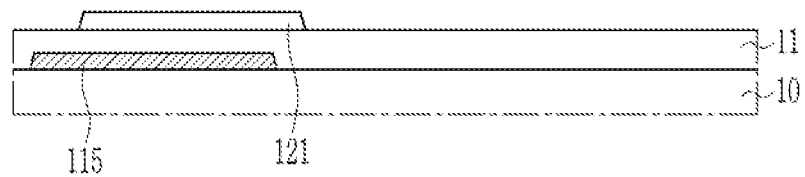

A cross-sectional view after the completion of the third step (Buffer) and the fourth step (Active) is illustrated in FIG. 5.

A fifth step (G.I.) represents a step of stacking the gate insulating layer 12 on the buffer layer 11 and the first semiconductor layer 121, and a pattern is not formed by using a separate mask. In this case, the gate insulating layer 12 is entirely stacked on the buffer layer 11 and the first semiconductor layer 121, unlike in FIG. 1. The gate insulating layer 12 may be formed of an inorganic insulating layer such as silicon oxide (SiOx). According to another exemplary embodiment, the gate insulating layer 12 may include silicon nitride (SiNx).

A sixth step (Gate) represents a step of stacking a material for the gate conductive layers on the gate insulating layer 12 and forming the gate conductive layers 154 and 154-1 by using the third mask 3M. In this case, the gate insulating layer 12 disposed below the gate conductive layers 154 and 154-1 is also etched together so that the gate insulating layer 12 is disposed only below the gate conductive layers 154 and 154-1 as illustrated in FIG. 1. The material for the gate conductive layers is formed to have a bilayer structure including a lower layer including titanium (Ti) and an upper layer including copper (Cu).

Figure 6:
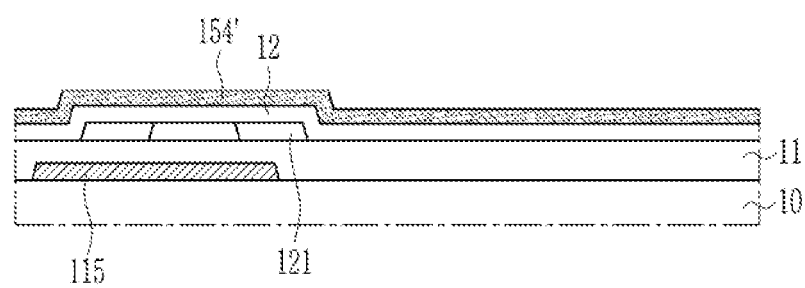
Figure 7:
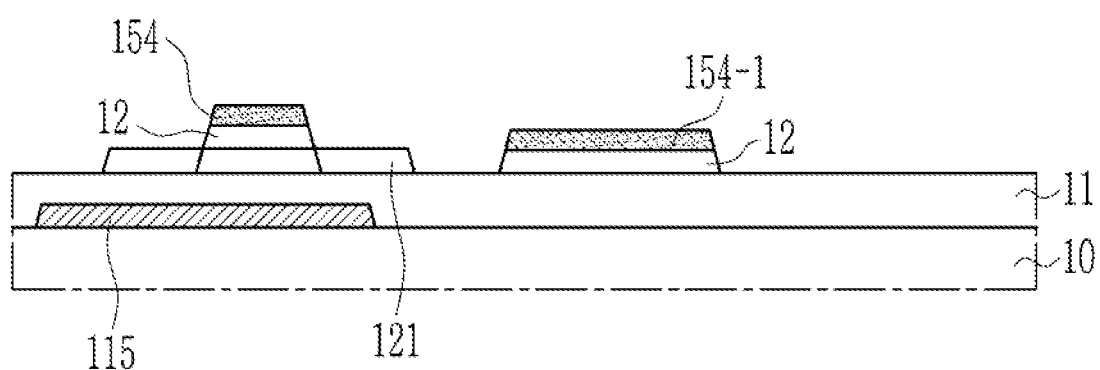

Cross-sectional views for the fifth step (G.I.) and the sixth step (Gate) are illustrated in FIG. 6 and FIG. 7. FIG. 6 illustrates a preliminary gate conductive layer 154' in the sixth step (Gate), and FIG. 7 illustrates patterns of the gate conductive layers 154 and 154-1 and the gate insulating layer 12 that are formed by etching the gate insulating layer 12 and the preliminary gate conductive layer 154' by using a third mask 3M.

A seventh step (ILD) represents a step of stacking the interlayer insulating layer 13 on the gate conductive layers 154 and 154-1 and the buffer layer 11, without using a separate mask. The interlayer insulating layer 13 may be thicker than other inorganic insulating layers. The interlayer insulating layer 13 may be also formed of an inorganic insulating layer such as silicon oxide (SiOx), silicon nitride (SiNx), or silicon oxynitride (SiON).

An eighth step (ANL) represents a step of annealing the interlayer insulating layer 13.

A ninth step (CNT1+CNT2 Dry Etch) represents a step of forming openings in the interlayer insulating layer 13 and the buffer layer 11, and specifically forming an opening in the interlayer insulating layer 13 using the fourth mask 4M and forming an opening in the buffer layer 11 using the fifth mask 5M together. In this case, dry etching may be performed on the interlayer insulating layer 13 using the fourth mask 4M to form the openings 50 and 51 that expose the drain region and the source region of the first semiconductor layer 121 respectively. Meanwhile, the opening 71 exposing the metal layer 115 may be formed by etching the interlayer insulating layer 13 through the fourth mask 4M and by further etching the buffer layer 11 through the fifth mask 5M to expose the metal layer 115. However, depending on the mask, only the interlayer insulating layer 13 may be removed by forming the openings 50 and 51 with the fourth mask 4M, and the interlayer insulating layer 13 and the buffer layer 11 may be sequentially removed by forming only the opening 71 with the fifth mask 5M.

Figure 8:
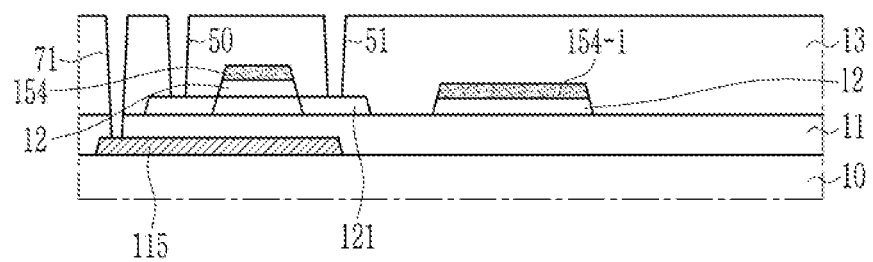

Cross-sectional views after the completion of the seventh step (ILD), the eighth step (ANL), and the ninth step (CNT1+CNT2 Dry Etch) are illustrated in FIG. 8.

A tenth step (S/D) represents a step of forming the data conductive layers 161, 161-1, 175, and 171-1 with the sixth mask 6M, and specifically stacking a material for the data conductive layers, and then patterning it by using the sixth mask 6M to form the data conductive layers 161, 161-1, 175, and 171-1. In this case, the data conductive layers 161, 161-1, 175, and 171-1 are electrically connected to the source region and the drain region of the first semiconductor layer 121 and the metal layer 115 through the openings 50, 51, and 71, respectively. The material for the data conductive layers is formed to have a bilayer structure including a lower layer containing titanium (Ti) and an upper layer containing copper (Cu), such as the material for the gate conductive layers.

Figure 9:
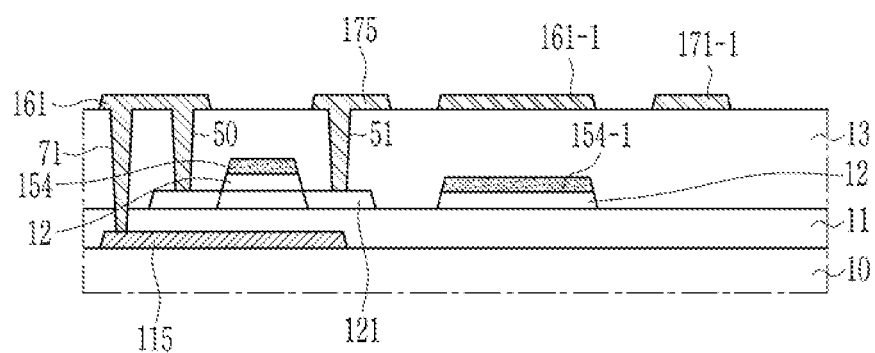

The cross-sectional view after the completion of the tenth step (S/D) is illustrated in FIG. 9.

An eleventh step (PVX) represents a step of stacking the passivation layer 14 on the data conductive layers 161, 161-1, 175, 171-1 and the interlayer insulating layer 13 without using a mask. The passivation layer 14 may be formed of an inorganic insulating layer such as silicon oxide (SiON) in the present exemplary embodiment.

A twelfth step (VIA) represents a step of stacking the upper insulating layer 15 on the passivation layer 14. The upper insulating layer 15 may be formed of an organic insulator such as a polyimide (PI) in the present exemplary embodiment.

In the thirteenth step CNT3, openings 81 and 84 are formed by etching the upper insulating layer 15 and the passivation layer 14 with a seventh mask 7M so that the output side electrode 161 and the pad electrode 171-1 are exposed.

Figure 10:
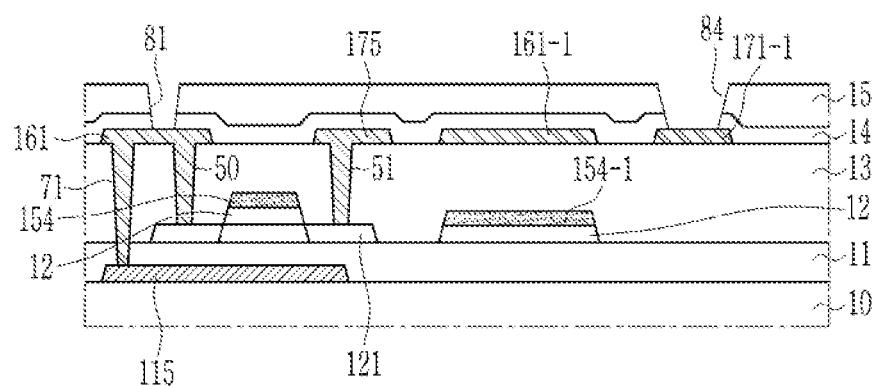

A cross-sectional view after the completion of the eleventh step (PVX), the twelfth step (VIA), and the thirteenth step (CNT3) is illustrated in FIG. 10.

Figure 11:
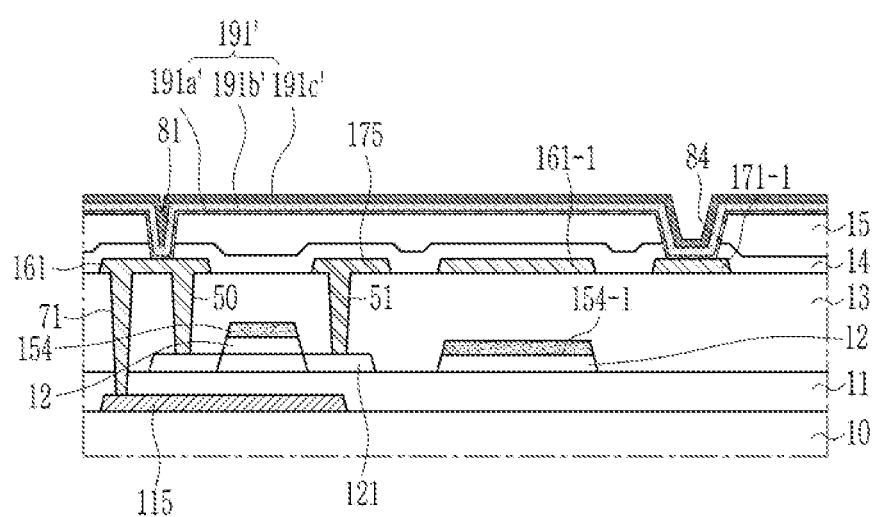
Figure 12:
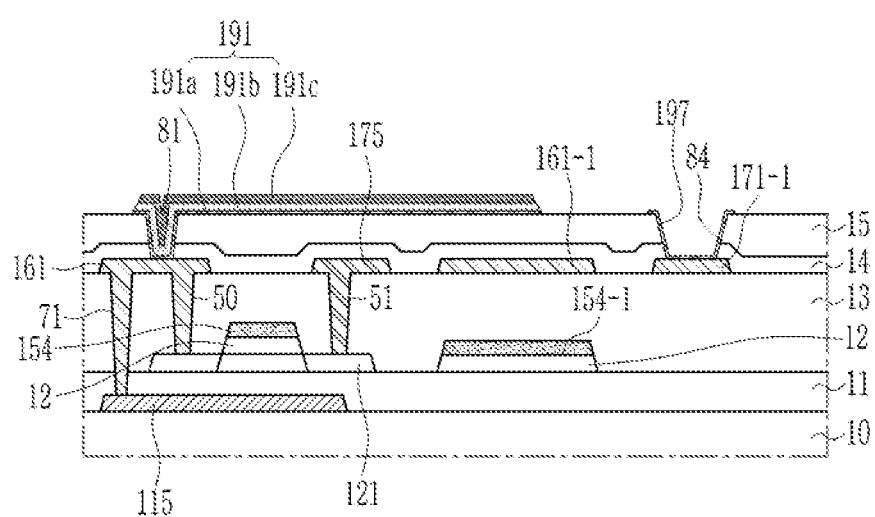

A fourteenth step (Pad anode electrode) represents a step of sequentially stacking a triple layer (hereinafter also referred to as an anode material), and then etching the triple layer by using an eighth mask 8M to form the anode 191 having the triple layer as it is and the pad contact electrode 197 having a single layer. A halftone mask may be used as the eighth mask 8M. In the present exemplary embodiment, the triple layer is formed to include the lower layer 191a including titanium (Ti), the intermediate layer 191b including silver (Ag), and the upper layer 191c including indium tin oxide (ITO). The fourteenth step (pad anode electrode) is illustrated in FIG. 11 and FIG. 12, and will now be separately described in detail with reference to FIG. 3.

Figure 13:
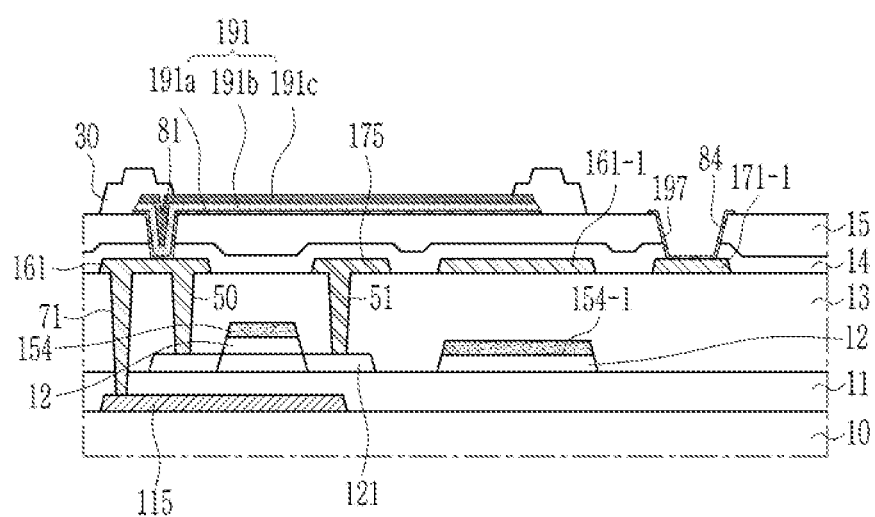

A fifteenth step (HPDL) represents a step of forming the partition wall 30 by using a ninth mask 9M. The partition walls 30 may be formed of an organic material such as a polyimide (PI) in the present exemplary embodiment. A cross-sectional view after the completion of the fifteenth step (HPDL) is illustrated in FIG. 13.

A step of forming the organic emission layer 35 on the anode 191 exposed by the partition wall 30 and a step of forming the cathode 196 covering the partition wall 30 and the organic emission layer 35 may be further included.

Hereinafter, the fourteenth step (Pad anode electrode) will be described in detail with reference to FIG. 3, and sub-steps of the fourteenth step illustrated in FIG. 3 will be sequentially described together with FIG. 11 and FIG. 12.

As illustrated in FIG. 3, the fourteenth step (Pad anode electrode) includes a fourteenth-1 step (Anode photo/anode 1st wet etch), a fourteenth-2 step (Ti dry etch), fourteenth-3 step (PR ashing), and a fourteenth-4 step (Anode 2nd wet etch/PR strip). In addition, FIG. 3 separately illustrates the display area PXL and the pad area PAD.

The fourteenth-1 step (anode photo/anode 1st wet etch) represents a step of forming a photoresist pattern by sequentially stacking an anode material layer 191' and a photoresist PR and exposing the photoresist PR and then etching it through a first wet etching process. Herein, the anode material layer 191' includes a plurality of layers having a lower layer material 191a' for forming the lower layer 191a, an intermediate layer material 191b' for forming the intermediate layer 191b, and an upper layer material 191c' for forming the upper layer 191c. That is, titanium (Ti) is formed on the entire upper insulating layer 15, and then silver (Ag) is formed entirely thereon. Thereafter, indium tin oxide (ITO) is formed entirely thereon. Titanium (Ti) is formed with a thickness of 30 Å or more. Referring to FIG. 3, the lower layer material 191a' containing titanium (Ti) is stacked with a thickness of 100 to 500 Å, the intermediate layer material 191b' containing silver (Ag) is stacked with a thickness of 850 Å, and the upper layer material 191c' containing indium tin oxide (ITO) is stacked with a thickness of 70 Å. Herein, the lower layer material 191a' containing titanium (Ti) may improve the contact characteristic with the upper insulating layer 15, and may prevent the silver (Ag) of the intermediate layer 191b from diffusing downwardly to the transistor, for example. The intermediate layer material 191b' containing silver (Ag) may serve to upwardly reflect light emitted from the organic emission layer. The upper layer material 191c' containing indium tin oxide (ITO) may also serve as a hole-injection layer of the organic emission layer 35. The upper layer material 191c' may contain a transparent conductive material other than ITO.

In the exemplary embodiment of FIG. 3, the lower layer material 191a' may contain titanium (Ti), the intermediate layer material 191b' may contain silver (Ag), and the upper layer material 191c' may contain indium tin oxide (ITO), but they may be expanded and applied to a material containing them.

The openings 81 and 84 for exposing the output side electrode 161 and the pad electrode 171-1 are respectively formed in the upper insulating layer 15 and the passivation layer 14 so that the anode material layer 191' is also formed in the openings 81 and 84 and connected to the output side electrode 161 and the pad electrode 171-1. A sectional view of this state is illustrated in FIG. 11.

The anode material layer 191' is stacked, and then the photoresist (PR) is stacked thereon. Then, the photoresist PR is exposed by using an eighth mask 8M and developed to form a pattern of the photoresist PR. Herein, the eighth mask 8M is a halftone mask with a transmissive region, a light-blocking region and a transflective region, and the transflective region is used to form the pattern of the photoresist PR disposed in the pad area PAD. In other words, the photoresist PR exposed through the transflective region of the eighth mask 8M is formed to an intermediate thickness without completely removing the photoresist or having the maximum thickness.

Next, the pattern of the photoresist PR is used as a mask to perform first wet etching (1st wet etch). An etchant (i.e., an anode etchant) used in the first wet etching (1st wet etch) is an etchant that may etch the intermediate layer material 191b' containing silver (Ag) and the upper layer material 191c' containing indium tin oxide (ITO) without etching the lower layer material 191a' containing titanium (Ti). As a result, when the first wet etching (1st wet etch) is performed, the intermediate layer material 191b' containing silver (Ag) and the upper layer material 191c' containing indium tin oxide (ITO) are etched, and the lower layer material 191a' containing titanium (Ti) is entirely connected without being etched. The anode etchant may include phosphoric acid, nitric acid, or acetic acid.

In the fourteenth-2 step (Ti dry etch), the lower layer material 191a' containing titanium (Ti) is also etched by performing dry-etching with the pattern of the photoresist PR as a mask. In this case, the pattern of the photoresist PR is also etched to have a reduced thickness. Meanwhile, since the upper insulating layer 15 is disposed under the lower layer material 191a' containing titanium (Ti), the upper insulating layer 15 is also partially etched. The upper insulating layer 15 may be an organic layer such as a polyimide (PI), and titanium (Ti) may be contained in the lower layer 191a to be dry-etched, and thus the titanium (Ti) that is in contact with the organic layer of the upper insulating layer 15 may be oxidized to produce titanium oxide (TiOx). When the titanium oxide (TiOx) is produced, the titanium oxide (TiOx) may interfere with dry etching. However, in the present exemplary embodiment, a pre-heat treatment Pre-heat is performed before the lower layer material 191a' containing titanium (Ti) is stacked on the upper insulating layer 15 by sputtering, in order to prevent the titanium oxide (TiOx) from being produced. Herein, the pre-heat treatment indicates a heat-treatment of the upper insulating layer 15 before deposition of the lower layer material 191a' containing titanium (Ti). The pre-heat treatment is heat treatment of the upper insulating layer 15 for 1 minute or more at a temperature of 80° C. or higher. In an exemplary embodiment, the pre-heat treatment may be performed at a temperature of about 120° C. for about 1 minute to 3 minutes. In an exemplary embodiment, the plurality of layers (i.e., the anode material layer 191') may be patterned to form a plurality of first patterned layers as the anode 191 of the organic light emitting diode and a plurality of second patterned layers as a preliminary pad contact electrode 197' in the display area PXL and the pad area PAD respectively.

Details of the reduction of the generation of titanium oxide (TiOx) by the pre-heat treatment and the pre-heat treatment conditions will be described in detail with reference to FIG. 21.

The fourteenth-3 (PR Ashing) is a process that removes the pattern of the photoresist PR of the remaining pad area PAD even after the fourteenth-2 (Ti dry Etch). In this case, the pattern of the photoresist (PR) disposed in the display area PXL remains without being removed.

Thereafter, in the fourteenth-4 step (Anode 2nd wet etch/PR strip), the second wet etching (2nd wet etch) is performed by using the pattern of the photoresist PR that remains in the display area PXL as a mask, and then a strip process is performed to remove the pattern of the photoresist PR disposed in the display area PXL. In an exemplary embodiment, the plurality of second patterned layers may be removed except the patterned lower layer as the pad contact electrode 197 in the pad area PAD.

First, the anode etchant used in the first wet etching (1st wet etch) is also used in the second wet etching (2nd wet etch). The anode etchant may include phosphoric acid, nitric acid, or acetic acid. The intermediate layer material 191b' containing silver (Ag) and the upper layer material 191c' containing indium tin oxide (ITO) formed in the pad area PAD are etched by the second wet etching, and the lower layer material 191a' containing titanium (Ti) remains without being etched, so that the pad contact electrode 197 has a single layer structure formed only of the lower layer 191a containing titanium (Ti).

Thereafter, a process of removing the photoresist PR (strip process) is performed using a liquid (PR stripper) for removing the photoresist PR.

The anode electrode 191 has a triple-layer structure through this process, and two layers of the triple-layer structure are removed to form the pad contact electrode 197 having a single layer structure.

In the foregoing, the organic light emitting diode display and the manufacturing method thereof have been described focusing on the cross-sectional structure of FIG. 1. Hereinafter, a circuit diagram, a waveform diagram, a layout diagram, and the like of one pixel PX will be described in detail with reference to FIG. 14 to FIG. 19.

Figure 14:
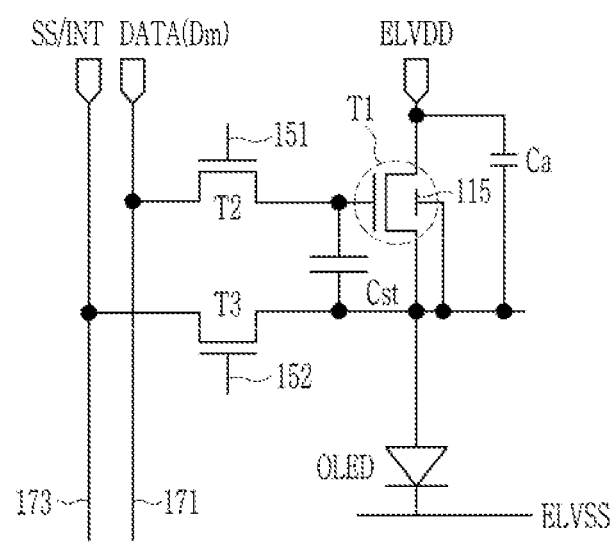
FIG. 14 illustrates an equivalent circuit diagram of one pixel of an organic light emitting diode display according to an exemplary embodiment.
Figure 15:
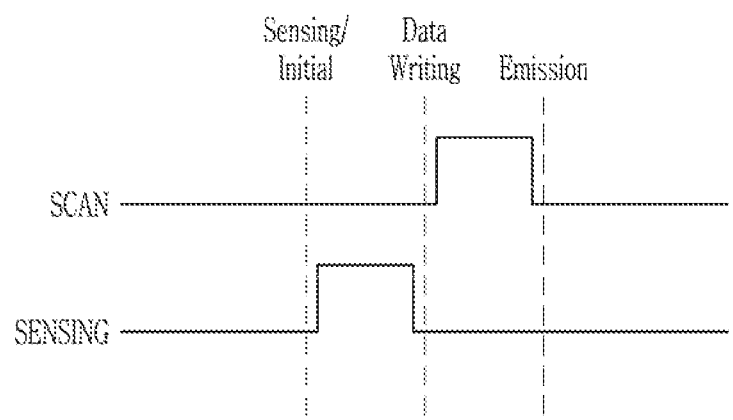
FIG. 15 illustrates a timing diagram of signals applied to one pixel of an organic light emitting diode display according to an exemplary embodiment.

The organic light emitting diode display having a cross-sectional structure as illustrated in FIG. 1 may have a pixel circuit structure as illustrated in FIG. 14, and a signal with a waveform of FIG. 15 may be applied to a pixel circuit of FIG. 15.

FIG. 14 illustrates an equivalent circuit diagram of one pixel of an organic light emitting diode display according to an exemplary embodiment, and FIG. 15 illustrates a timing diagram of signals applied to one pixel of an organic light emitting diode display according to an exemplary embodiment.

Referring to FIG. 14, a pixel PX of the organic light emitting diode display includes a plurality of transistors T1, T2, and T3 connected to various signal lines 151, 152, 171, and 173, a storage capacitor Cst, a capacitor Ca, and an organic light emitting diode OLED.

As the organic light emitting diode display according to the exemplary embodiment of FIG. 14, an organic light emitting diode display that is used with high resolution is illustrated, and a structure of one pixel PX will be described as follows.

The transistors T1, T2, and T3 included in one pixel PX include a driving transistor T1 for transferring an output current to the organic light emitting diode OLED, a second transistor T2 (also referred to as a switching transistor)

connected with a scan line 151, and a third transistor T3 (also referred to as an initialization transistor or a sensing transistor) connected with a previous-stage scan line 152. According to another exemplary embodiment, a signal line for applying a gate-on voltage with timing that is different from that of the previous-stage scan line 152 may be connected to the third transistor T3.

The scan line 151 is connected to a gate driver (not illustrated) to transfer a scan signal Sn to a gate electrode of the second transistor T2.

The previous-stage scan line 152 is connected to the gate driver, and transfers a previous-stage scan signal S(n−1) applied to the pixel PX disposed at a previous stage to a gate electrode of the third transistor T3.

A data line 171 is a wire for transferring a data voltage Dm generated from the data driver (not illustrated), and one data line 171 may be formed for one pixel array. One data line 171 and one scan line 151 are used to select one pixel PX and input the data voltage Dm into the corresponding pixel PX. The luminance at which the organic light emitting diode OLED (also referred to as the organic light emitting element) emits is changed depending on the data voltage Dm supplied to the pixel PX.

A driving voltage ELVDD is applied to one electrode of the driving transistor T1, and a driving low voltage ELVSS is applied to one electrode of the organic light emitting diode OLED.

Hereinafter, the transistors will be described.

First, the driving transistor T1 serves to adjust the magnitude of a current that is outputted depending on the data voltage Dm applied to the gate electrode, and a driving current Id outputted therefrom is applied to the organic light emitting diode OLED so as to adjust the brightness of the organic light emitting diode OLED depending on the data voltage Dm. For this purpose, a first electrode (input side electrode) of the driving transistor T1 is disposed to receive the driving voltage ELVDD, and a second electrode (output side electrode) thereof is connected with a first electrode (hereinafter referred to as an anode or a pixel electrode) of the organic light emitting diode OLED. In addition, a gate electrode of the driving transistor T1 may be connected to a second electrode (output side electrode) of the second transistor T2 to receive the data voltage Dm.

The gate electrode of the driving transistor T1 is connected to one electrode of the storage capacitor Cst. The storage capacitor Cst serves to ensure that the data voltage Dm transferred to the gate electrode of the driving transistor T1 is maintained for one frame. Accordingly, a voltage of the gate electrode of the driving transistor T1 changes depending on a voltage stored in the storage capacitor Cst, and thus the driving current Id outputted by the driving transistor T1 changes and is constantly outputted for one frame.

According to an exemplary embodiment, the driving transistor T1 further includes the metal layer 115 below the semiconductor layer where a channel thereof is disposed. The metal layer 115 overlaps the channel and the gate electrode of the driving transistor T1 to serve to increase the performance of the driving transistor T1 and to maintain the voltage of the gate electrode. As the metal layer 115 overlaps the gate electrode, the voltage of the gate electrode is maintained to complement the role of the storage capacitor Cst. Hereinafter, a capacitor added by an overlap between the metal layer 115 and the gate electrode of the driving transistor T1 is referred to as an overlapped capacitor (not illustrated). The metal layer 115 is electrically connected to the second electrode (output side electrode) of the driving transistor T1, and thus is also connected to the anode of the organic light emitting diode OLED.

The second transistor T2 serves to accept the data voltage Dm into the pixel PX. The gate electrode of the second transistor T2 is connected to the scan line 151, the first electrode is connected to the data line 171, and the second electrode (output side electrode) is connected to the gate electrode of the driving transistor T1. When the second transistor T2 is turned on depending on the scan signal Sn transferred through the scan line 151, the data voltage Dm transferred through the data line 171 is transferred to the gate electrode of the driving transistor T1 to be stored in the storage capacitor Cst.

The third transistor T3 serves to initialize the second electrode (output side electrode) of the driving transistor T1, an electrode of the storage capacitor Cst, and the anode of the organic light emitting diode OLED. A gate electrode of the third transistor T3 is connected to the previous-stage scan line 152, and a first electrode thereof is connected to an initialization voltage line 173. A second electrode (output side of electrode) of the third transistor T3 is electrically connected to the second electrode (output side electrode) of the driving transistor T1, and thus is also connected to the anode of the organic light emitting diode OLED and the metal layer 115.

The initialization voltage line 173 does not supply only the initialization voltage, but is also used as a wire for sensing a voltage of the anode connected with the second electrode of the third transistor T3 depending on periods, and in this case, it may be referred to as a sensing line. As a result, the third transistor T3 may also be referred to as a sense transistor.

An operation of the third transistor T3 will now be described. When the organic light emitting diode OLED emits light, the voltage of the anode is stored in a first electrode of the storage capacitor Cst. In this case, the data voltage Dm is stored in a second electrode of the storage capacitor Cst. In this case, when a gate-on voltage is applied to the gate electrode of the third transistor T3, the initialization voltage line 173 operates as a sensing line, and the voltage of the anode is transferred to a sensor (not illustrated) through the sensing line. Hereinafter, this is referred to as a sensing section. Then, the initialization voltage line 173 applies an initialization voltage Vint to initialize the voltage of the anode during a remaining period of the period where the gate-on voltage is applied to the gate electrode of the third transistor T3. Hereinafter, this is referred to as an initialization period.

The data voltage Dm may be corrected and supplied to the pixel PX when the voltage sensed in the sensing period is different from the voltage of the anode expected in the determination based on the applied data voltage Dm. For example, the characteristic of the driving transistor T1 may be changed, and in this case, the data voltage Dm may be appropriately adjusted depending on the changed characteristic by sensing the change of the characteristic to allow the organic light emitting diode OLED to normally emit light.

Two electrodes of the storage capacitor Cst serve to maintain the data voltage Dm and the anode voltage of the organic light emitting diode OLED (the electrode voltage on the output side of the driving transistor) for one frame.

However, an area occupied by the pixel PX has recently been reduced while a high-resolution organic light emitting diode display is manufactured. Thus, an area for forming the storage capacitor Cst is reduced, and storage capacitance that can be maintained for one frame may not be ensured. An additional capacitor may be further included.

In the exemplary embodiment of FIG. 14, an additional capacitor Ca is further included, to ensure sufficient storage capacity to maintain the voltage of the anode of the organic light emitting diode OLED for one frame.

The additional capacitor Ca has a first electrode connected to the anode of the organic light emitting diode OLED and a second electrode to which the driving voltage ELVDD is applied, to maintain the anode voltage of the organic light emitting diode OLED.

According to another exemplary embodiment, an overlapped capacitor is formed by the overlap between the metal layer 115 and the gate electrode of the driving transistor T1.

An operation of one pixel of an organic light emitting diode display according to an exemplary embodiment will be described by applying the waveform diagram of FIG. 15 to a structure of the pixel PX of FIG. 14.

In FIG. 15, a signal indicated by SCAN is applied to the scan line 151, and a signal indicated by SENSING is applied to the previous-stage scan line 152.

The previous-stage scan signal S(n-1) of a high level is supplied to the pixel PX through the previous-stage scan line 152 during an initialization period. Then, the third transistor T3 which receives it is turned on. In this case, the voltage stored in the anode of the organic light emitting diode OLED is checked through the initialization voltage line 173 (sensing period), and then the voltage of the anode of the organic light emitting diode OLED is changed to an initialization voltage Vint to initialize it. (Initialization period)

When the driving transistor T1 disposed in each pixel PX has a different threshold voltage Vth due to process variation or the characteristic of which the driving transistor T1 changes over a long period of time, these are sensed during the sensing period, thereby allowing the light emitting diode OLED to normally emit light.

Then, the scan signal Sn of a high level is applied to the pixel PX through the scan line 151 during a data writing period Data Writing. The second transistor T2 is turned on by the scan signal Sn of the high level. When the second transistor T2 is turned on, the data voltage Dm is inputted into the gate electrode of the driving transistor T1 through the second transistor T2 to be stored in a first electrode of the storage capacitor Cst.

The degree of turn-on of the driving transistor T1 is determined depending on the data voltage Dm applied to the gate electrode, an output thereof is determined depending on the degree of turn-on thereof, and the output of the driving transistor T1 is transferred to the anode of the organic light emitting diode OLED. In this case, the voltage of the anode of the organic light emitting diode OLED is stored in the overlapped capacitor or the additional capacitor Ca as well as the storage capacitor Cst and is maintained for one frame.

The pixel structure has been described based on the circuit diagram of FIG. 14 hereinbefore.

Hereinafter, how the pixel PX is implemented according to an exemplary embodiment will be described with reference to FIG. 16 to FIG. 19.

Figure 16:
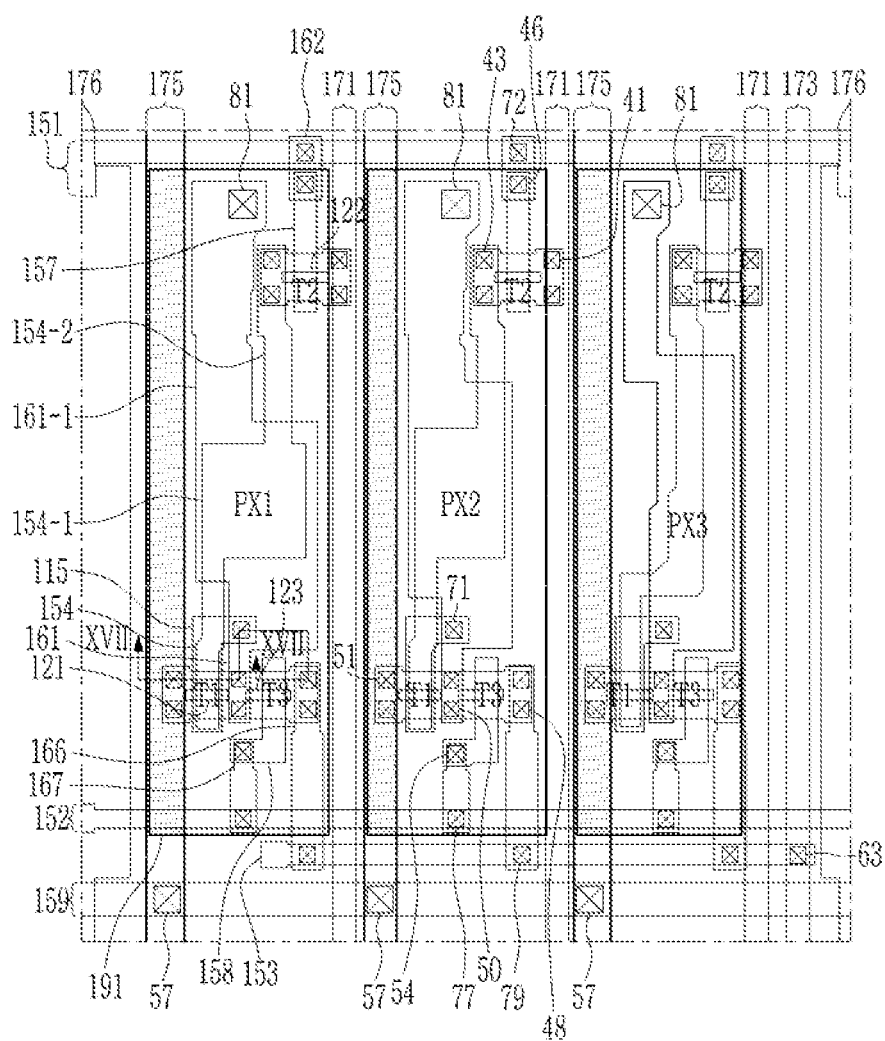
FIG. 16 illustrates a layout view of a pixel of an organic light emitting diode display according to an exemplary embodiment.
Figure 17:
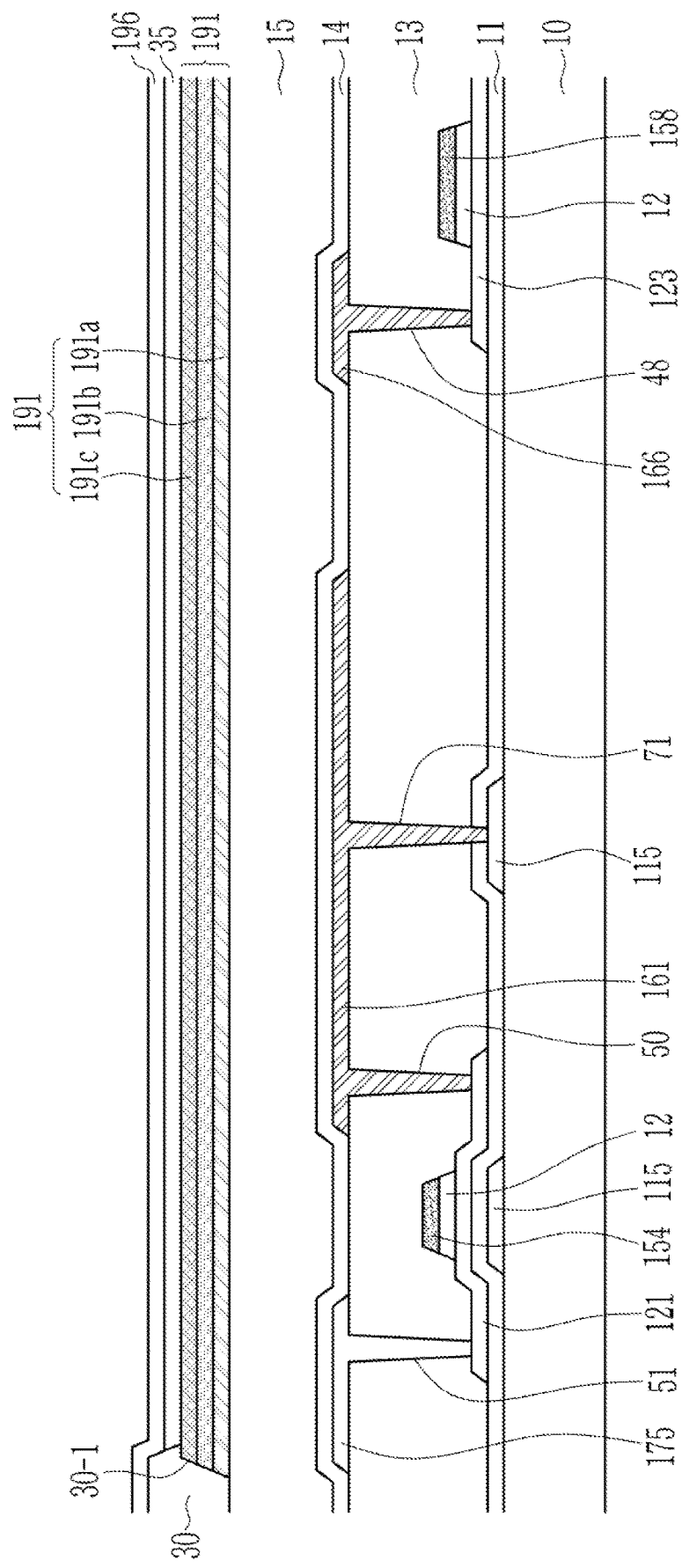
FIG. 17 illustrates a cross-sectional view taken along a line XVII-XVII of FIG. 16.
Figure 18:
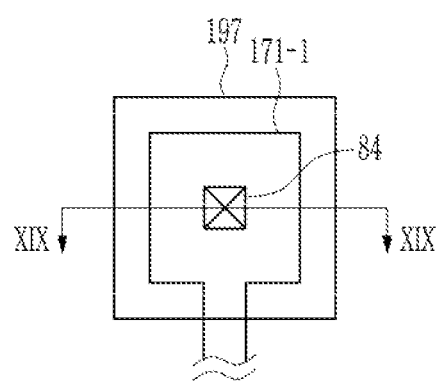
FIG. 18 illustrates a layout view of a pad area according to an exemplary embodiment.
Figure 19:
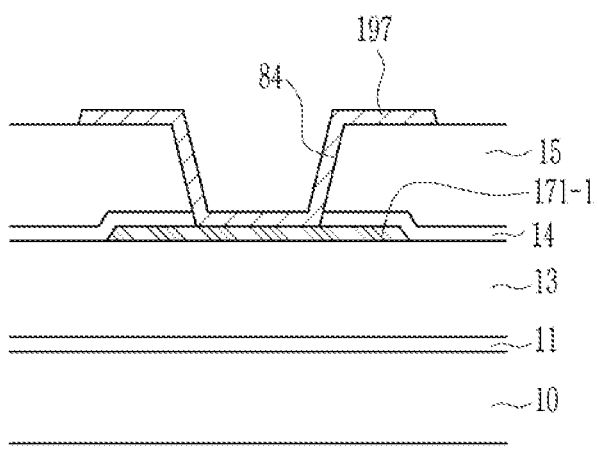
FIG. 19 illustrates a cross-sectional view taken along a line XIX-XIX of FIG. 18.

FIG. 16 and FIG. 17 illustrate a layout view and a cross-sectional view of one pixel of the display area, and FIG. 18 and FIG. 19 illustrate a layout view and a cross-sectional view of the pad area.

First, a structure of one pixel in the display area will be described with reference to FIG. 16 and FIG. 17.

FIG. 16 illustrates a layout view of a pixel of an organic light emitting diode display according to an exemplary embodiment, and FIG. 17 illustrates a cross-sectional view taken along a line XVII-XVII of FIG. 16.

Referring to FIG. 16 and FIG. 17, in an organic light emitting diode display according to an exemplary embodiment of the present invention, a metal layer 115, semiconductor layers 121, 122, and 123, gate conductive layers 151, 152, 153, 154, 154-1, 154-2, 157, 158, and 159, data conductive layers 171, 173, 175, 176, 161, 161-1, 162, 166, and 167, an anode 191, an organic emission layer 35, and a cathode 196 are formed on a substrate 10, and these layers are insulated from each other with an insulating layer therebetween unless they are connected through openings.

The substrate 10 may formed of a glass substrate or a flexible substrate such as a plastic or polyimide (PI). In the case of a flexible substrate, an additional inorganic insulating layer may be formed, unlike with the glass substrate.

The metal layer 115 is formed on the substrate 10. The metal layer 115 includes a connector and a channel overlapped portion overlapping a channel of a driving transistor T1. The connector of the metal layer 115 is connected to the output side electrode 161 of the driving transistor T1, which will be described later. Since the output side electrode 161 of the driving transistor T1 receives the voltage of the anode 191, the metal layer 115 also receives the voltage of the anode 191. The metal layer 115 and the gate electrode 154 of the driving transistor T1 may constitute an overlapped capacitor.

A buffer layer 11 is disposed on the substrate 10 and the metal layer 115 to cover them. The buffer layer 11 may be formed of a conductive metal material.

The semiconductor layers 121, 122, and 123 are formed on the buffer layer 11. The semiconductor layers 121, 122, and 123 includes channels of the driving transistor T1, a second transistor T2, and a third transistor T3, respectively. According to the present exemplary embodiment, the semiconductor layers 121, 122, and 123 may be formed of an oxide semiconductor. The first semiconductor layer 121, which is a semiconductor layer of the driving transistor T1, includes a channel region and source and drain regions disposed at opposite sides of the channel region. The second semiconductor layer 122, which is a semiconductor layer of the second transistor T2, includes a channel region and source and drain regions disposed at opposite sides of the channel region, and the third semiconductor 123, which is a semiconductor layer of the third transistor T3, includes a channel region and source and drain regions.

The channel region of each of the semiconductor layers 121, 122, and 123 may be formed as two lines, including openings at the center of the quadrangle, or as only one line to connect the source and drain regions.

The source and drain regions of each of the semiconductor layers 121, 122, and 123 are electrically connected to a first electrode (input side electrode) and a second electrode (output side electrode) thereof, respectively. In addition, the source and drain regions are extended to be electrically connected to other layers through openings.

In the exemplary embodiment of FIG. 16, the first semiconductor layer 121 and the third semiconductor layer 123 are connected to each other.

A gate insulating layer 12 is disposed on the semiconductor layers 121, 122, and 123 and the buffer layer 11 to cover them. The gate insulating layer 12 may be formed of an inorganic insulating material.

The gate conductive layers 151, 152, 153, 154, 154-1, 154-2, 157, 158, and 159 are disposed on the interlayer insulating layer 13. The gate conductive layers 151, 152, 153, 154, 154-1, 154-2, 157, 158 and 159 include the scan line 151, the previous-stage scan line 152, the initialization voltage transfer unit 153, the gate electrode 154 of the driving transistor T1, the first electrode 154-1 of the storage capacitor Cst, the output electrode 154-2 of the second transistor T2, the gate electrode 157 of the second transistor T2, the gate electrode 158 of the third transistor T3, and the horizontal driving voltage line 159. The gate electrode 154 of the driving transistor T1 is connected to the first electrode 154-1 of the storage capacitor Cst and the output electrode 154-2 of the second transistor T2.

The scan line 151 extends in a first direction (horizontal direction), and the previous-stage scan line 152 also extends in the first direction (horizontal direction).

The initialization voltage transfer unit 153 has an island shape that extends in a first direction. The initialization voltage transfer unit 153 is a structure for connecting a plurality of pixels to an initialization voltage line 173 formed per a predetermined number of pixel arrays. For example, the initialization voltage transfer unit 153 extends through an adjacent pixel PX in the first direction, to a position where the initialization voltage line 173 is to be formed. In the present exemplary embodiment, one initialization voltage line 173 is formed for each pixel PX including three subpixels PX1, PX2, and PX3.

The horizontal driving voltage line 159 extends in the first direction (horizontal direction) and intersects a driving voltage line 175 extending in the second direction (vertical direction). The horizontal driving voltage line 159 is disposed between adjacent pixels PX in a row direction, and is electrically connected to the driving voltage line 175 through an opening 57 for each of the adjacent subpixels PX1, PX2, and PX3 in a column direction.

The gate electrode 154 of the driving transistor T1 overlaps the first semiconductor layer 121 in which the channel of the driving transistor T1 is disposed, and is connected with the first electrode 154-1 of the storage capacitor Cst and is also connected with the output electrode 154-2 of the second transistor T2 through the first electrode 154-1 of the storage capacitor Cst. As a result, the data voltage Dm transferred into the pixel PX through the second transistor T2 is also transferred to the first electrode 154-1 of the storage capacitor Cst and the gate electrode 154 of the driving transistor T1 through the opening 43.

In addition, the first electrode 154-1 of the storage capacitor Cst and an extension of the metal layer 115 overlap each other to constitute an overlapped capacitor.

FIG. 16 illustrates the three subpixels PX1, PX2, and PX3 constituting one pixel PX, and the extensions of the gate electrode 154 of the driving transistor T1 of the subpixels PX1, PX2, and PX3 are illustrated to have various sizes.

The gate electrode 157 of the second transistor T2 has an island-like structure, and overlaps the second semiconductor layer 122 of the second transistor T2. A channel of the second transistor T2 is formed at a position where the second semiconductor layer 122 and the gate electrode 157 of the second transistor T2 overlap each other. The gate electrode 157 of the second transistor T2 is electrically connected to the present-stage scan line 151 through a second gate electrode connector 162. The present-stage scan line 151 is connected to the second gate electrode connector 162 through an opening 72, and the second gate electrode connector 162 is connected to the gate electrode 157 of the second transistor T2 through an opening 46.

The gate electrode 158 of the third transistor T3 has an island-like structure and overlaps with the third semiconductor 123 of the third transistor T3. A channel of the third transistor T3 is formed at a position where the third semiconductor 123 and the gate electrode 158 overlap each other. The gate electrode 158 is electrically connected to the previous-stage scan line 152 through a third gate electrode connector 167. The previous-stage scan line 152 is electrically connected to the third gate electrode connector 167 through an opening 77, and the third gate electrode connector 167 is electrically connected to the gate electrode 158 of the third transistor T3 through an opening 54.

The interlayer insulating layer 13 is disposed on the gate conductive layers 151, 152, 153, 154, 154-1, 154-2, 157, 158, and 159 and the gate insulating layer 12 to cover them. The interlayer insulating layer 13 may be formed of an inorganic insulating material to be thick.

The data conductive layers 171, 173, 175, 176, 161, 161-1, 162, 166, and 167 are disposed on the interlayer insulating layer 13. The data conductive layer includes the data line 171, the initialization voltage line 173, the driving voltage line 175, the driving low voltage line 176, the output electrode 161 of the driving transistor T1, the second electrode 161-1 of the storage capacitor Cst, the first electrode (input side electrode) 166 of the third transistor T3, and the third gate electrode connector 167.

The data line 171 is formed for each pixel array, and extends in the second direction (vertical direction) perpendicular to the first direction. The data line 171 is connected to the second semiconductor layer 122 of the second transistor T2 through an opening 41 to apply the data voltage Dm to the second transistor T2. The data line 171 extends to the pad area, and a pad electrode 171-1 having an extended width is disposed in the pad area. The pad electrode 171-1 and the data line 171 may be integrally formed, and the pad electrode 171-1 will be described with reference to FIG. 18 and FIG. 19.

The initializing voltage line 173 extends in the second direction to apply an initialization voltage Vint. The initialization voltage line 173 is not formed for each pixel array, and one initialization voltage line 173 is formed for each pixel PX including three subpixels PX1, PX2, and PX3 in the present exemplary embodiment. The initialization voltage line 173 is connected to the initialization voltage transfer unit 153 through an opening 63, and the initialization voltage transfer unit 153 is connected to the first electrode 166 of the third transistor T3 through an opening 79. The first electrode 166 of the third transistor T3 is connected to the third semiconductor 123 of the third transistor T3 through an opening 48. As a result, the initialization voltage Vint is applied to the first electrode (input side electrode) of the third transistor T3 of each pixel.

The driving voltage line 175 and the driving low voltage line 176 also extends in the second direction (vertical direction). A driving voltage line 175 is disposed in each subpixel of three subpixels PX1, PX2 and PX3, but the driving low voltage line 176 is disposed in one pixel array PX containing three subpixels PX1, PX2, and PX3. The driving voltage line 175 transfers the driving voltage ELVDD, and is connected to the first semiconductor layer 121 of the driving transistor T1 through two openings 51 to transfer the driving voltage ELVDD to the first electrode of the driving transistor T1. The driving voltage line 175 may have a narrow width as compared with the driving low voltage line 176. The driving low voltage line 176 may have a narrow width in a region overlapping a wire disposed in another layer, and in FIG. 16, the driving low-voltage line 176 has a narrow width at a portion overlapping the scan line 151. The driving low voltage line 176 having a wide width forms an electrical connection structure to transfer the driving low voltage ELVSS even to the cathode disposed at an upper portion thereof. For example, a certain level of width is required for forming a contact with a laser or the like and electrically connecting the contact.

The output side electrode 161 of the driving transistor T1 is electrically connected to the first semiconductor layer 121 of the driving transistor T1 through an opening 50, and extends to the second electrode 161-1 of the storage capacitor Cst. Thereafter, it extends again to be electrically connected to the anode 191, which will be described later, through an opening 81.

The second gate electrode connector 162 electrically connects the present-stage scan line 151 with the gate electrode 157 of the second transistor T2 via two openings 46 and 72.

The first electrode 166 of the third transistor T3 is connected to the third semiconductor 123 through an opening 48 to serve as the input side electrode, and extends to be electrically connected to the initialization voltage transfer unit 153 through an opening 79. As a result, the initialization voltage Vint is transferred directly to the first electrode 166 of the third transistor T3.

The third gate electrode connector 167 electrically connects the previous-stage scan line 152 with the gate electrode 158 of the third transistor T3 via two openings 54 and 77.

A passivation layer 14 is disposed on the data conductive layers 171, 173, 175, 176, 161, 161-1, 162, 166, and 167 and the interlayer insulating layer 13. The passivation layer 14 may be formed of an inorganic insulating layer.

An upper insulating layer 15 is disposed on the passivation layer 14, and the upper insulating layer 15 may be formed of an organic layer. An anode 191 and a pad contact electrode 197 are formed on the upper insulating layer 15. The pad contact electrode 197 is separately shown in FIG. 18 and FIG. 19, and will be described in detail with reference to FIG. 18 and FIG. 19.

The anode 191 transfers a current, which is outputted from the driving transistor T1 to a first electrode of the organic light emitting diode OLED, to the organic emission layer. The anode 191 is electrically connected to the second electrode 161-1 for the storage capacitor through an opening 81, and the second electrode 161-1 for the storage capacitor is connected to the output side electrode 161 of the driving transistor T1, to transfer an output of the driving transistor T1 to the anode 191. Referring to the cross-sectional view of FIG. 17, the anode 191 has a triple-layer structure including a lower layer 191a, an intermediate layer 191b, and an upper layer 191c. In contrast, the pad contact electrode 197 is formed as a single layer formed of the same material as the lower layer 191a. (See FIG. 19)

Referring to FIG. 16, the anode 191 is disposed over an entire surface of the pixel to overlap the driving transistor T1, the second transistor T2, and the third transistor T3, and a side of the driving voltage line 175 and a side of the anode 191 are overlapped with each other side by side.

Herein, an additional capacitor Ca is formed at a region where the anode 191 and the driving voltage line overlap each other.

The anode 191 overlaps the driving voltage line 175 without overlapping the driving low voltage line 176. However, according to another exemplary embodiment, it may overlap the driving low voltage line 176 to constitute an additional capacitor.

A partition wall 30 having an opening 30-1 is disposed on the anode 191, an organic emission layer 35 is disposed in an opening 30-1 of the partition wall 30, and a cathode 196 covering the partition wall 30 and the organic emission layer 35 is formed. Although not illustrated, the cathode 196 is electrically connected to the driving low voltage line 176 to receive the driving low voltage ELVSS.

Hereinafter, a structure of the pad area will be described in detail with reference to FIG. 18 and FIG. 19.

FIG. 18 illustrates a layout view of a pad area according to an exemplary embodiment, and FIG. 19 illustrates a cross-sectional view taken along line XIX-XIX of FIG. 18.

Referring to FIG. 18, the pad electrode 171-1 and the pad contact electrode 197 electrically connected thereto through the opening 84 are formed in the pad area.

The pad electrode 171-1 indicates an extended end of the data line 171 extending to the pad area through the display area. The pad electrode 171-1 is included in the data conductive layer in the same manner as the data line.

Referring to FIG. 19, the pad electrode 171-1 is covered with the passivation layer 14 and the upper insulating layer 15, and the opening 84 which exposes a portion of the pad electrode 171-1 is formed in the passivation layer 14 and the upper insulating layer 15.

A pad contact electrode 197 is formed on the upper insulating layer 15, and is electrically connected to the pad electrode 171-1 through the opening 84. The pad contact electrode 197 may have a wider width than the pad electrode 171-1.

In addition, as illustrated in FIG. 19, the pad contact electrode 197 has a single-layer structure, which is different from the triple-layer structure of the anode 191 formed by a same process. The pad contact electrode 197 may be formed of a same material as the lower layer 191a of the triple layer structure of the anode 191.

The pad electrode 171-1 disposed at one end of the data line 171 has been described with reference to FIG. 18 and FIG. 19.

Referring to FIG. 1, since the gate conductive layers and the data conductive layers have the same double-layer structure, the pad electrode disposed at the end of the scan line 151 may have a structure similar to that of FIG. 18 and FIG. 19. However, since the pad electrode 171-1 is disposed in the gate conductive layers, not in the data conductive layers, there is a difference in that the pad electrode is disposed under the interlayer insulating layer 13. The pad contact electrode 197 electrically connected to the pad electrode 171-1 has a single layer structure as shown in FIG. 18 and FIG. 19, and may be formed of the same material as the lower layer of the anode 191. According to another exemplary embodiment, an additional connector may be formed in the data conductive layers to facilitate contact between the gate conductive layers and the pad contact electrode.

Hereinafter, a cross-sectional structure of an organic light emitting diode display including a color conversion layer will be described with reference to FIG. 20.

FIG. 20 illustrates a cross-sectional view of an organic light emitting diode display according to an exemplary embodiment.

As illustrated in the cross-sectional view of FIG. 20, the organic light emitting diode display further includes an upper substrate 10-1, an adhesive layer 250, a light blocking layer 220, and a capping layer 240 configured to cover the organic light emitting diode OLED in addition to the constituent elements of FIG. 1.

The exemplary embodiment of FIG. 20 will be described as follows based on the differences from that of FIG. 1.

The partition wall 30 and the cathode 196 are covered with the capping layer 240. The capping layer 240 may include a triple layer of an inorganic layer/an organic layer/an inorganic layer, and serve to prevent water or air from penetrating into the organic emission layer 35 from the outside. The pad area where the pad contact electrode 197 is disposed may not be covered by the capping layer 240.

Meanwhile, the upper substrate 10-1 includes the light blocking layer 220 and the color conversion layer 230. The upper substrate 10-1 may be formed of the same glass as the substrate 10 disposed at a lower portion thereof. However, according to another exemplary embodiment, both the substrates 10 and 10-1 may be formed of a flexible material.

The color conversion layer 230 is disposed in a region through which light emitted from the organic emission layer 35 is transmitted to the lower surface of the upper substrate 10-1, and the light blocking layer 220 is disposed between color conversion layers 230. For example, an opening is formed in the light blocking layer 220, and the color conversion layer 230 is disposed in the opening of the light blocking layer 220. The light blocking layer 220 may be extended to the pad area as well as the display area.

The color conversion layer 230 serves to convert light of a specific color (for example, blue light) emitted by the organic emission layer into one of primary colors such as red and green by adjusting a wavelength of the light of the specific color. Generally, the color conversion layer 230 may include a quantum dot (QD) material. In an exemplary embodiment, all the light emitted through the organic emission layer 35 displays a same color, but three primary colors of light such as red, green, and blue may be displayed through the color conversion layer 230 disposed in each pixel.

In the meantime, a color filter layer (not illustrated) may be further included in addition to the color conversion layer 230 to increase color purity. When the color purity is increased as described above, each primary color is advantageously displayed more clearly. However, if sufficient color purity is ensured by the color conversion layer 230 alone, it may not include an additional color filter.

According to another exemplary embodiment, the organic emission layer 35 may emit one of red, green, and blue (three primary colors) light for each pixel PX, and the color conversion layer 230 or the color filter may not be included.

Referring to FIG. 20, the capping layer 240, the color conversion layer 230, and the light blocking layer 220 are attached by the adhesive layer 250. Although FIG. 20 illustrates the adhesive layer 250 disposed on the pad area and the pad contact electrode 197, the pad contact electrode 197 needs to receive signals from a driving chip or a printed circuit board (PCB), and thus may be connected to a separate signal line, while the adhesive layer 250 may be disposed thereon to cover the signal line.

Hereinafter, a process condition for eliminating the problem of dry etching caused by titanium oxide (TiOx) through a pre-heat treatment will be described with reference to FIG. 21 to FIG. 23.

Figure 21:
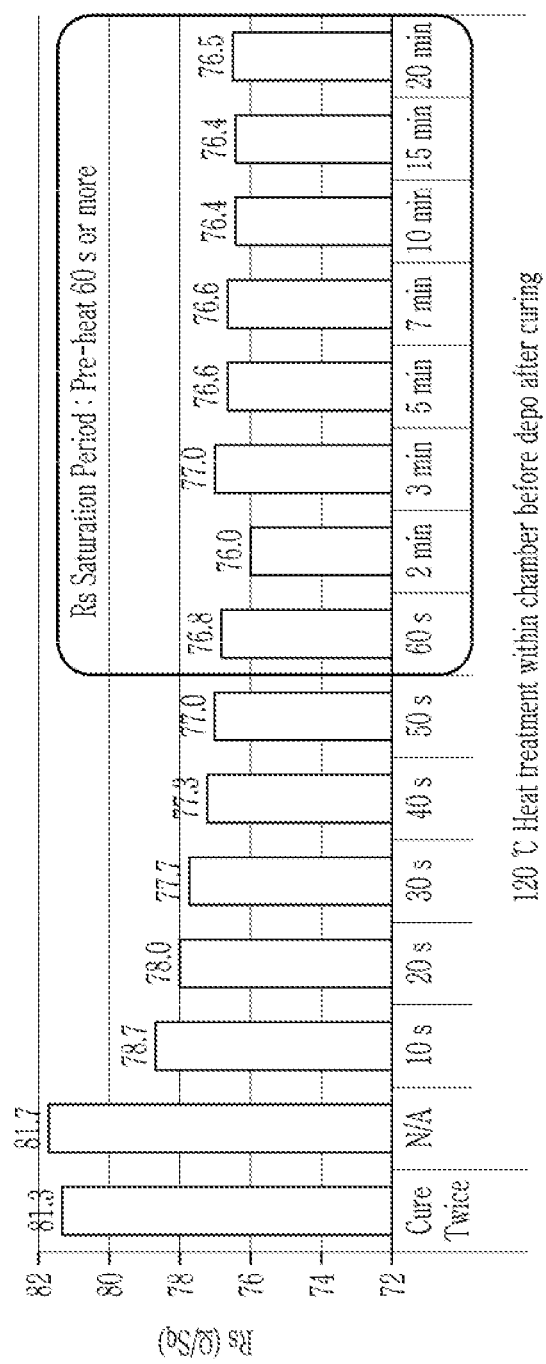
FIG. 21 to FIG. 23 are graphs illustrating an etching effect depending on a pre-heat treatment process.
Figure 22:
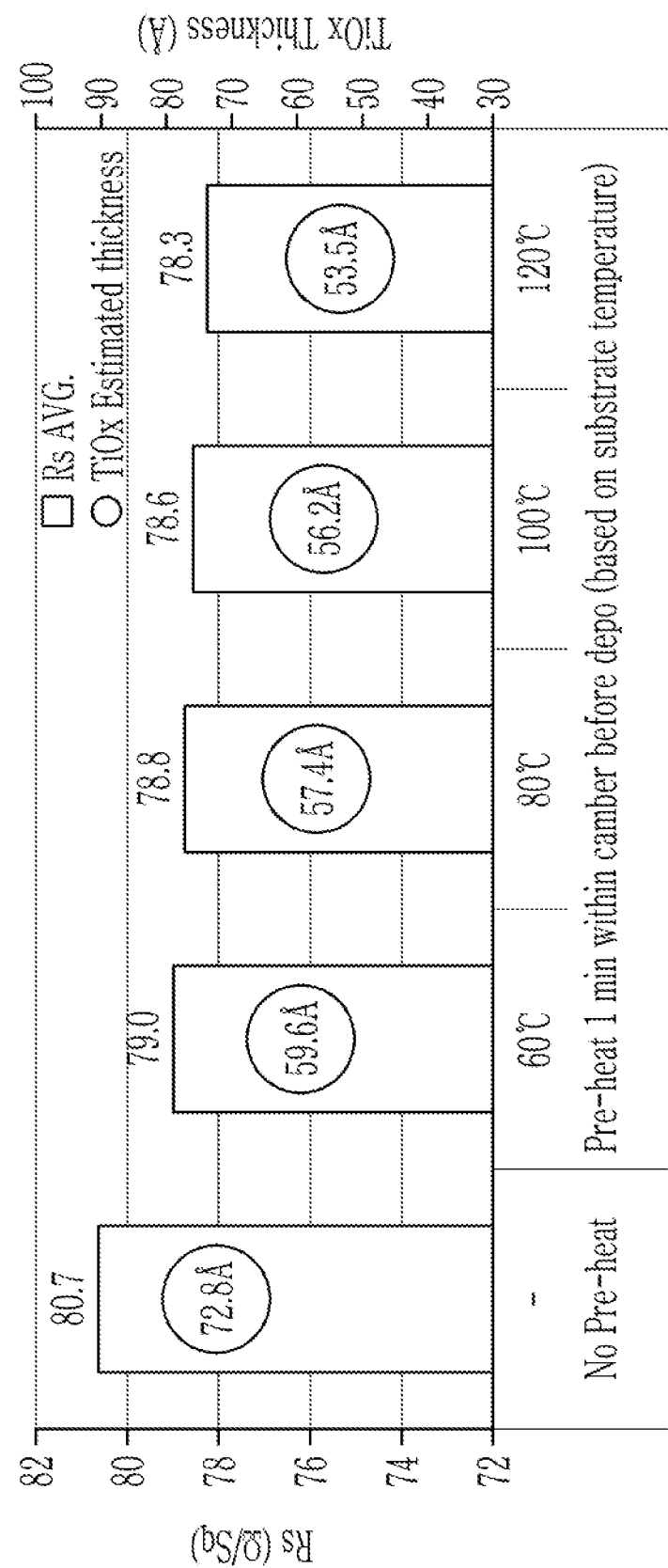
Figure 23:
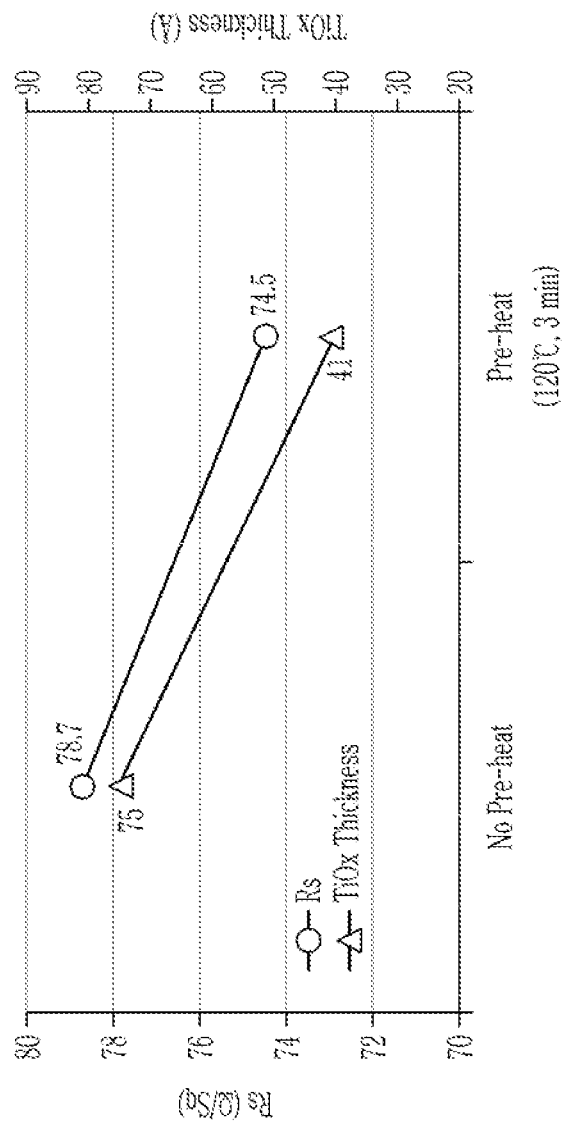

FIG. 21 to FIG. 23 are graphs illustrating an etching effect depending on a pre-heat treatment process.

In the case where when titanium (Ti) is dry-etched, an organic layer disposed below the titanium is also dry-etched, titanium oxide (TiOx) may be produced, thereby stopping the dry-etching where the titanium oxide (TiOx) are formed, and thus some regions may not be etched.

When the titanium oxide (TiOx) is formed, the sheet resistance (Rs [unit: Ω/square]) increases as compared to the case where only titanium (Ti) is present. Accordingly, referring to FIG. 21 to FIG. 23, the thickness of the titanium oxide (TiOx) is estimated based on the sheet resistance Rs.

First, FIG. 21 illustrates comparisons of the sheet resistance Rs of the cases where a pure process was carried out twice, no treatment was performed (N/A), and the pre-heat treatment (Pre-heat) was performed for various times. Herein, the cure process indicates a process of heat treatment for one hour at a high temperature of 230° C. The pre-heat treatment indicates a process of heat-treating the upper insulating layer 15, which is the organic layer disposed below the titanium (Ti), at a relatively low temperature prior to stacking the titanium (Ti). In the case of FIG. 21, the pre-heat treatment Pre-heat was performed at 120° C.

As illustrated in FIG. 21, it is seen that the sheet resistance Rs is reduced more in the case where the process was performed twice than in the case where no treatment was performed (N/A), but the difference is not significant.

However, it is seen that the sheet resistance Rs is remarkably reduced even if the pre-heat treatment Pre-heat is performed for a short time of within 1 minute, and when it exceeds 1 minute, the sheet resistance Rs is further reduced to have values within a certain range. The values of the sheet resistance Rs are about 76-77 Ω/square, where the expected thickness of titanium oxide (TiOx) is about 42 Å.

Referring to FIG. 21, it is seen that the best effect on the sheet resistance Rs is obtained in the pre-heat treatment Pre-heat of about 1 minute to 3 minutes.

In FIG. 21, the effect of the pre-heat treatment Pre-heat on the sheet resistance Rs is measured by fixing the temperature for the pre-heat treatment Pre-heat to 120° C. and varying the time thereof.

Hereinafter, the sheet resistance Rs compared by varying the temperature for the pre-heat treatment Pre-heat will be described with reference to FIG. 22. In this case, the time for the pre-heat treatment Pre-heat was 1 minute.

In FIG. 22, the bar graph shows the values of the sheet resistance Rs, and the numerical value shown in the circle therein represents the thickness of titanium oxide (TiOx).

It is seen that the thickness of titanium oxide (TiOx) is greatly reduced regardless of the temperature of the pre-heat treatment Pre-heat, and less titanium oxide (TiOx) is produced at 120° C.

Based on the test results of FIG. 21 and FIG. 22, the temperature for the pre-heat treatment Pre-heat may be around 120° C., and the time for the pre-heat treatment Pre-heat may be 1 to 3 minutes.

Referring to FIG. 23, the thickness difference between the sheet resistance Rs and the titanium oxide (TiOx) is compared when there is no pre-heat treatment Pre-heat and when the pre-heat treatment Pre-heat is appropriately performed. In FIG. 23, the pre-heat treatment Pre-heat is carried out at 120° C. for 3 minutes.

In the case of no pre-heat treatment Pre-heat, the thicknesses of titanium oxide (TiOx) is 75 Å with the sheet resistance of 78.7 Ω/square, but when the pre-heat treatment Pre-heat is performed, the thicknesses of titanium oxide (TiOx) is 41 Å with the sheet resistance of 74.5 Ω/square. The thickness of titanium oxide (TiOx) in the case of no-pre-heat treatment Pre-heat may be nearly double the thickness of titanium oxide (TiOx) in the case when the pre-heat treatment Pre-heat is performed. In other words, in the case where the pre-heat treatment Pre-heat is not performed, etching may not be performed in at least a portion of the titanium layer during dry etching. However, when the pre-heat treatment Pre-heat is appropriately conducted, the thickness of the titanium oxide (TiOx) is reduced to about half, so that even if the titanium layer is dry-etched, the problem does not occur.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
a substrate including a display area and a pad area;
a first thin film transistor disposed on the display area;
two insulating layers disposed on the first thin film transistor;
an organic light emitting diode connected to the first thin film transistor, and disposed on the two insulating layers;
a pad electrode disposed on the pad area; and
a pad contact electrode comprising only a single conductive layer, disposed on an upper portion of the pad electrode and electrically connected to the pad electrode,
wherein the organic light emitting diode includes an anode, an organic emission layer, and a cathode,
the anode includes a lower layer, an intermediate layer, and an upper layer,
the pad contact electrode is in contact with the pad electrode and formed of a material of the lower layer of the anode, and
the two insulating layers are disposed between the pad electrode and the pad contact electrode.

2. The organic light emitting diode display of claim 1, wherein the pad electrode extends from a signal line connected to the first thin film transistor.

3. The organic light emitting diode display of claim 1, wherein the lower layer contains titanium (Ti).

4. The organic light emitting diode display of claim 3, wherein the intermediate layer contains silver (Ag), and the upper layer contains an indium tin oxide (ITO) or a transparent conductive material.

5. The organic light emitting diode display of claim 4, wherein one of the two insulating layers is an upper insulating layer disposed below the lower layer, and
wherein the upper insulating layer includes an organic material.

6. The organic light emitting diode display of claim 5, wherein the lower layer is in contact with the upper insulating layer to increase adhesion thereto and to prevent the silver (Ag) of the intermediate layer from diffusing downwardly toward the first thin film transistor,
the intermediate layer reflects light emitted from the organic emission layer upwardly, and
the upper layer injects holes into the organic emission layer.

7. The organic light emitting diode display of claim 1, wherein the first thin film transistor disposed on the display area is a driving transistor.

8. The organic light emitting diode display of claim 7, further comprising:
a second thin film transistor disposed on the display area to transfer a data voltage to a gate electrode of the driving transistor; and
a third thin film transistor disposed on the display area to initialize a voltage of an output side electrode of the driving transistor.

9. The organic light emitting diode display of claim 8, further comprising:

a data line to which the data voltage is transferred,
wherein the pad electrode is an extended portion of the data line into the pad area.

10. The organic light emitting diode display of claim 8, further comprising:
a driving voltage line configured to transfer a driving voltage to the driving transistor;
a driving low voltage line configured to transfer a driving low voltage to the cathode; and
an initialization voltage line connected to the third thin film transistor.

11. The organic light emitting diode display of claim 8, further comprising:
a metal layer disposed between a first semiconductor layer of the driving transistor and the substrate.

12. The organic light emitting diode display of claim 1, further comprising:
a capping layer covering the organic light emitting diode to prevent moisture from penetrating into the organic light emitting diode,
wherein the capping layer includes a first inorganic layer, an organic layer, and a second inorganic layer stacked on each other.

13. The organic light emitting diode display of claim 12, further comprising:
an upper substrate facing the substrate;
a light blocking layer disposed on the upper substrate to have an opening; and
a color conversion layer disposed in the opening of the light blocking layer,
wherein the color conversion layer converts light emitted from the organic emission layer into one of three primary colors of light.

14. An organic light emitting diode display comprising:
a substrate including a display area and a pad area;
a first thin film transistor disposed on the display area;
an interlayer insulating layer covering the first thin film transistor;
an upper insulating layer disposed on an upper surface of the interlayer insulating layer;
an organic light emitting diode disposed on the upper insulating layer and electrically connected to the first thin film transistor;
a pad electrode disposed on the pad area;
an opening exposing partially the pad electrode and penetrating the interlayer insulating layer and the upper insulating layer; and
a pad contact electrode comprising only a single conductive layer, disposed on an upper surface of the upper insulating layer and electrically connected to the pad electrode through the opening,
wherein the organic light emitting diode includes an anode, an organic emission layer, and a cathode,
wherein the anode includes a lower layer, an intermediate layer, and an upper layer, and
wherein the pad contact electrode and the lower layer of the anode are formed of a same material as each other.

15. The organic light emitting diode display of claim 14, wherein the upper insulating layer includes an organic material.

16. The organic light emitting diode display of claim 14, wherein the pad contact electrode is in contact with the pad electrode via the opening.

* * * * *